US006950330B2

(12) United States Patent
Thompson et al.

(10) Patent No.: US 6,950,330 B2
(45) Date of Patent: Sep. 27, 2005

(54) ADDRESSING OF MEMORY MATRIX

(75) Inventors: Michael O. Thompson, Ithaca, NY (US); Per-Erik Nordal, Asker (NO); Hans Gude Gudesen, Brussels (BE); Johan Carlsson, Linköping (SE); Göran Gustafsson, Linköping (SE)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 10/934,573

(22) Filed: Sep. 7, 2004

(65) Prior Publication Data

US 2005/0058010 A1 Mar. 17, 2005

Related U.S. Application Data

(63) Continuation of application No. 09/899,093, filed on Jul. 6, 2001, now Pat. No. 6,804,138.

(30) Foreign Application Priority Data

Jul. 7, 2000 (NO) ................................................. 003508

(51) Int. Cl.[7] ............................................. G11C 11/22

(52) U.S. Cl. ............. 365/145; 365/189.11; 365/230.06; 365/189.06; 365/191

(58) Field of Search ............................ 365/145, 189.01, 365/230.01, 189.11, 230.06, 189.06, 191

(56) References Cited

U.S. PATENT DOCUMENTS

| 2,972,734 | A | | 2/1961 | Anderson |
| 3,002,182 | A | | 9/1961 | Anderson |
| 4,169,258 | A | | 9/1979 | Tannas, Jr. |
| 4,873,455 | A | * | 10/1989 | de Chambost et al. ....... 706/33 |
| 5,550,770 | A | | 8/1996 | Kuroda |

* cited by examiner

*Primary Examiner*—Anh Phung
*Assistant Examiner*—J. H. Hur
(74) *Attorney, Agent, or Firm*—Birch, Stewart, Kolasch & Birch, LLP

(57) ABSTRACT

A method of driving a passive matrix display or memory array of cells comprising an electrically polarizable material exhibiting hysteresis, in particular a ferroelectric material, wherein the polarization state of individual cells can be switched by application of electric potentials or voltages to word and bit lines in the matrix or array.

20 Claims, 15 Drawing Sheets

ADDRESSING OF MEMORY MATRIX

This application is a Continaution of application Ser. No. 09/899,093, filed on Jul. 6, 2001 now U.S. Pat. No. 6,804,138, and for which priority is claimed under 35 U.S.C. § 120; the entire contents of all are hereby incorporated by reference.

FIELD OF THE INVENTION

The present invention relates to a method of driving a passive matrix-addressable display or memory array of cells comprising an electrically polarizable material exhibiting hysteresis.

BACKGROUND INFORMATION

Passive matrix addressing implies the use of two sets of parallel electrodes that cross each other, typically in orthogonal fashion, creating a matrix of crossing points that can be individually accessed electrically by selective excitation of the appropriate electrodes from the edge of the matrix. Advantages of this arrangement include simplicity of manufacture and high density of crossing points, provided the functionality of the matrix device can be achieved via the two-terminal connections available at each crossing point. Of particular interest in the present context are display and memory applications involving matrices where the electrodes at each crossing point sandwich a material in a capacitor-like structure, henceforth termed a "cell", and where the material in the cells exhibits polarizability and hysteresis. The latter property confers non-volatility on the devices, i.e. they exhibit a memory effect in the absence of an applied external field. By application of a potential difference between the two electrodes in a given cell, the material in the cell is subjected to an electric field which evokes a polarization response, the direction and magnitude of which may be thus set and left in a desired state, representing e.g. a logic "0" or "1" in a memory application or a brightness level in a display application. Likewise, the polarization status in a given cell may be altered or deduced by renewed application of voltages to the two electrodes addressing that cell.

Examples of passive matrix devices employing ferroelectric memory substances can be found in the literature dating back 40–50 years. Thus, E. G. Merz and J. R. Anderson described a barium titanate based memory device in 1955 (W. J. Merz and J. R. Anderson, "Ferroelectric storage devices", Bell.Lab.Record. 1, pp. 335–342 (1955)), and similar work was also reported by others promptly thereafter (see, e.g. C. F. Pulvari "Ferroelectrics and their memory applications", IRE Transactions CP-3, pp. 3–11 (1956), and D. S. Campbell "Barium titanate and its use as a memory store", J. Brit. IRE 17 (7) pp. 385–395 (1957)). An example of a passive matrix addressed display rendered non-volatile by a ferroelectric material can be found in U.S. Pat. No. 3,725,899 (W. Greubel) filed in 1970.

In view of its long history and apparent advantages, it is remarkable that the passive matrix addressing principle in conjunction with ferroelectrics has not had a greater impact technologically and commercially. While important reasons for this may be traced back to the lack of ferroelectric materials that satisfy the full range (technical and commercial) of minimum requirements for the devices in question, a major factor has been certain inherent negative attributes of passive matrix addressing. Prominent among these is the problem of disturbing non-addressed crossing points. The phenomenon is well recognized and extensively discussed in the literature, both for displays and in memory arrays. Thus, the basics shall not be discussed here, but the reader is referred to, e.g.: A. Sobel: "Some constraints on the operation of matrix displays", IEEE Trans.Electron Devices (Corresp.) ED-18, p. 797 (1971), and L. E. Tannas Jr., "Flat panel displays and CRTs", pp. 106 & seq., (Van Nostrand 1985). Depending on the type of device in question, different criteria for avoiding or reducing disturbance of non-addressed crossing points can be defined. Generally, it is sought to lower the sensitivity of each cell in the matrix to small-signal disturbances, which can be achieved by cells that exhibit a non-linear voltage-current response, involving e.g. thresholding, rectification and/or various forms of hysteresis.

Although general applicability is claimed for the present invention, particular focus shall be directed towards ferroelectric memories, where a thin film of ferroelectric material is stimulated at the matrix crossing points, exhibiting a hysteresis curve as illustrated generically in FIG. 1. Typically, writing of a bit is accomplished by applying a voltage differential across the film at a crossing point, causing the ferroelectric to polarize or switch polarization. Reading is analogously achieved by applying a voltage of a given polarization, which either causes the polarization to remain unchanged after removal of the voltage or to flip to the opposite direction. In the former case, a small current will flow in response to the applied voltage, while in the latter case the polarization change causes a current pulse of magnitude larger than a predefined threshold level. A crossing point may arbitrarily be defined as representing a "0" bit in the former case, a "1" bit in the latter.

A material with hysteresis curve as shown in FIG. 1 will change its net polarization direction upon application of a field that exceeds $V_C$. However, partial switching shall take place upon application of voltages below this value, to an extent depending on the material in question. Thus, in a matrix with a large number of crossing points, repeated stimuli of non-addressed crossing points may ultimately degrade the polarization states in the matrix to the point where erroneous reading results. The amount and type of stimulus received by non-addressed crossing points in a cross-bar passive matrix during write and read operations depends on how the voltages are managed on all addressing lines in the matrix during these operations, henceforth termed the "pulsing protocol". The choice of voltage pulsing protocol depends on a number of factors, and different schemes have been proposed in the literature, for applications involving memory materials exhibiting hysteresis. Examples of prior art shall now be given.

U.S. Pat. No. 2,942,239 (J. P. Eckert, Jr. & al.) discloses pulsing protocols for memory arrays with magnetic cores, each with a magnetic hysteresis curve analogous to the ferroelectric one shown in FIG. 1. Although claiming general applicability for memory elements exhibiting bistable states of remnant polarization, including ferroelectrics, their invention contains only specific teachings on magnetic data storage where separate contributions to the total magnetic flux in each cell are added or subtracted from several independent lines intersecting in each cell. This is reflected in how cells are linked up in the proffered embodiments, with a readout protocol providing superposition of a slow, or "background" biasing stimulus being applied to all or a subset (e.g. a column or a row) of the cells in the matrix, and with a fast selection pulse being applied between the crossing lines containing the addressed cell. No teachings are given on efficient voltage protocols for two-terminal, capacitor-like memory cells combining high speed, random access to data with restoration of the destructively read information.

U.S. Pat. No. 3,002,182 (J. R. Anderson) concerns the problem of polarization loss by partial switching of ferroelectric memory cells in passive matrix addressed arrays of ferroelectric-filled capacitors. To reduce the partial switching polarization loss during writing, this patent teaches the use of simultaneous application of addressing pulses to an addressed row and column such that the former executes an electrical potential swing of typically +2$V_s$/3 to +3$V_s$/4 (where $V_s$ is the nominal switching voltage) while the latter swings to a negative value sufficient for the potential difference between the electrodes at the selected crossing point to reach the value $V_s$. With the remaining columns being switched to a potential in the range +$V_s$/3 to +$V_s$/4, only the selected cell in the matrix is subjected to a significant switching field, and partial switching at the other crossing points is strongly reduced (the reduction depends on the material properties of the ferroelectric, in particular the shape of the hysteresis curve and the magnitude of the dielectric constant). In an alternative pulsing scheme, the same patent teaches the application of additional "disturbance compensating pulses" subsequent to each writing operation, where the selected row is clamped at zero potential while the selected and non-selected columns are pulsed to +$V_s$/4 to +$V_s$/3 and −$V_s$/4 to −$V_s$/3, respectively. The latter operation is claimed to reduce the partial switching induced loss of polarization even further. No physical explanation was provided for this choice of pulsing scheme, however, which appears to rely to a large degree on the inventor's empirical experience with the ferroelectric materials of his day, in particular barium titanate. While the basic choice of polarities appear plausible, the description given is insufficient to provide an adequate guide to selection of pulse magnitudes and timing in concrete terms for generalized cases. For reading out the stored information or clearing the cells before a writing operation, the inventor proposes the application of the full switching voltage −$V_s$ to the selected row or rows, referring to "a manner well known in the art". Selection of the column electrode voltages is treated in a nebulous fashion. It may appear that the selected column electrode is clamped at ground, with all non-selected column electrodes biased to −$V_s$/3 or −$V_s$/4 (cf. FIG. 4B in U.S. Pat. No. 3,002,182). However, this leads to a voltage load of 2$V_s$/3 to 3$V_s$/4 on the non-selected cells in the same row as the selected cell, with obvious danger of partial switching. Thus, it would at best seem that the invention shall be poorly suited for situations where a large number of read operations are involved between each write, and the general applicability to realistic ferroelectric devices appears doubtful.

U.S. Pat. No. 3,859,642 (J. Mar) discloses a memory concept based on a passive matrix addressing scheme, where an array of capacitors with programmable bistable capacitance values is subjected to a two-level excitation during the reading cycle. The memory function resides in the bistability of the capacitors, which are assumed to be of the metal-insulator-semiconductor (MIS) type or equivalent, exhibiting a hysteresis loop which is centered around an offset voltage and well removed from the zero offset point. Writing of data is achieved by biasing the row and column lines crossing at the selected capacitor to polarities +V and −V, respectively, alternatively to −V and +V, respectively, depending on which of the two bistable states is to be written. The resulting net bias is thus +−2V on the selected capacitor, and does not exceed an absolute magnitude V on non-selected capacitors, where V is defined as being below threshold for writing. Partial writing is apparently not considered to be a problem, and no particular provisions are described in that connection beyond the simple scheme referred here. Thus, the teachings of U.S. Pat. No. 3,859,642 cannot be seen as having any prior art significance relative to the subject matter of the present invention.

A one-third voltage selection scheme for addressing a ferroelectric matrix arrangement is disclosed in U.S. Pat. No. 4,169,258 (L. E. Tannas, Jr.). In this case, the x- and y lines in a passive matrix addressing arrangement are subjected to a pulsing protocol where (unipolar) voltages with relative magnitudes 0, ⅓, ⅔ and 1 are applied in a coordinated fashion to all x and y lines. Here, voltage value 1 is the nominal voltage amplitude employed for driving a given cell from a logic state "OFF" to "ON", or vice versa, with the typical coercive voltage being exemplified as a value between ½ and ⅔. An important limitation of the scheme taught in the patent is that the pulse protocols are predicated upon all cells starting out with the same initial polarization magnitude and direction ("OFF"), i.e. the whole matrix must be blanked to an "OFF" state before a new pattern of states can be written into the matrix cells. Furthermore, any "ON" state on the same y-line as the addressed cell shall receive a disturb pulse of magnitude ⅔ in the direction of the "OFF" state, leading to partial switching in most known ferroelectrics. While these limitations may be acceptable in certain types of displays and memories, this is not the case in the vast majority of applications.

Total blanking is not subsumed under what Tannas Jr. terms the conventional method "one-half selection scheme", which is described in detail in the cited U.S. Pat. No. 4,169,258. However, the latter scheme exposes the non-selected cells to disturbing pulses of relative value ½. This is generally deemed unacceptable for all practical memory applications employing traditional ferroelectric materials such as inorganic ceramics. Furthermore, the one-half voltage selection scheme is only described in terms of single switching events in the addressed cells, which destroy the pre-switching polarization states.

Thus, in passive matrix-addressable memory and display applications where it is desired to be able to change the logic content of individual cells without disturbing other cells or having to blank and reset the whole device, there is a clear need for improvement over the existing prior art.

SUMMARY OF THE INVENTION

The present invention can provide voltage vs. time protocols for driving the x and y passive matrix addressing lines in non-volatile memories exhibiting ferroelectric-like hysteresis curves so as to minimize disturbance of non-selected memory cells during writing as well as reading of data to/from said memories.

The present invention can describe voltage protocols that reduce charging/discharging transients and thus achieve high speed.

In an embodiment of the present invention the polarizable material can be a ferroelectric material, wherein the polarization state of individual, separately selectable cells can be switched to a desired condition by application of electric potentials or voltages to word and bit lines forming an addressing matrix, wherein a voltage pulsing protocol with n voltage or potential levels, n≧3, such that the voltage pulsing protocol defines a timing sequence for individually controlling the voltage levels applied to word and bit lines forming the matrix in a time-coordinated fashion, arranging said timing sequence to encompass at least two distinct parts, including a "read cycle" during which charges flowing between said selected bit line(s) and the cells connecting to said bit line(s) are sensed, and a "refresh/write cycle" during which polarization state(s) in cells connecting with selected word and bit lines are brought to correspond with a set of predetermined logical states or data values.

The present invention further addresses pulsing protocols for the addressing of individual crossing points in passive matrices used for data storage and display purposes. The present invention addresses the avoidance of disturbing non-addressed crossing points in the same matrices and further addresses minimizing the cumulative signal from non-addressed cells in such matrices during reading of stored data. Applications shall typically involve, but are not limited to, matrices containing a ferroelectric thin film that acts as non-volatile memory material.

A further embodiment of the present invention describes voltage protocols that permit simple, reliable and cheap electronic circuitry to perform drive and sense operations on the memory matrices.

The features of the present invention can be achieved with a method, which controls individually a potential on selected word and bit lines to approach or coincide with one of n predefined potential levels, where $n \geq 3$. The potentials on said selected word and bit lines form subsets of n potentials involving $n_{WORD}$ and $n_{BIT}$ potentials, respectively. Additionally, the potentials are controlled on all word- and bit lines in a time-coordinated fashion according to a protocol or timing sequence, whereby word lines are latched in a predetermined sequence to potentials are controlled selected among the $n_{WORD}$ potentials. Bit lines are either latched in a predetermined sequence to potentials selected among the $n_{BIT}$ potentials or they are latched during a certain period of the timing sequence connected to circuitry that senses the charges flowing between the bit line(s) and the cells connecting to said bit line(s). The timing sequence is arranged to encompass at least two distinct parts, including a "read cycle" where charges flowing between said selected bit line(s) and the cells connecting to said bit line(s) are sensed, and a "refresh/write cycle" where polarization state(s) in cells connecting with selected word- and bit lines are brought to correspond with a set of predetermined values.

According to an embodiment of the invention, one or more bit lines float in response to charges flowing between a bit line and the cells connecting to the bit line during the read cycle, and latching all voltages on the word and bit lines during the refresh/write cycle.

In a further embodiment of the present invention the values n=3, $n_{WORD}$=3, and $n_{BIT}$=3 are selected in case voltages across non-addressed cells that do not significantly exceed $V_s/2$, where $V_s$ is the voltage across the addressed cell during read, refresh and write cycles.

In another embodiment of the present invention the values n=4, $n_{WORD}$=4, and $n_{BIT}$=4 are selected in case voltages across non-addressed cells that do not significantly exceed $V_s/3$, where $V_s$ is the voltage across the addressed cell during read, refresh and write cycles.

In still another embodiment of the present invention the values n=5, $n_{WORD}$=3, and $n_{BIT}$=3 are selected in case voltages across non-addressed cells that do not significantly exceed $V_s/3$, where $V_s$ is the voltage across the addressed cell during read, refresh and write cycles.

The present invention can subject non-addressed cells along an active word line and along active bit line(s) to a maximum voltage during the read/write cycle that deviates by a controlled value from the exact values $V_s/2$ or $V_s/3$. The non-addressed cells can be subjected along an active word line to a voltage of a magnitude that exceeds the exact values $V_s/2$ or $V_s/3$ by a controlled voltage increment, while at the same time subjecting non-addressed cells along selected active bit lines to a voltage of a magnitude that is less than the exact values $V_s/2$ or $V_s/3$ by a controlled voltage decrement. The controlled voltage increment and voltage decrement can be equal to each other.

The present invention can add a controlled voltage increment $\delta_1$ to potentials $\Phi_{inactive}WL$ of inactive word lines and adding a controlled voltage increment $\delta_2$ to potentials $\Phi_{inactive}BL$ of inactive bit lines, where $\delta_1=\delta_2=0$ corresponds to the voltage pulsing protocols with maximum $V_s/2$ or $V_s/3$ voltage exposure on non-selected cells. In this connection is preferably $\delta_1=\delta_2\neq0$.

The present invention can control a quiescent potential (the potential imposed on the word and bit lines during the time between each time the voltage pulsing protocol is employed) to have the same value on all word and bit lines, i.e. a zero voltage is imposed on all cells. Further the present invention can select the quiescent potentials on one or more of the word and bit lines among one of the following: a) System ground, b) Addressed word line at initiation of pulsing protocol, c) Addressed bit line at initiation of pulsing protocol, d) Power supply voltage($V_{CC}$). Additionally, the present invention can select the potential on a selected bit line or bit lines in a quiescent state such that it differs from that at the onset of a floating period (read cycle), and bringing said potential from a quiescent value to that at the onset of the floating period, where it is latched for a period of time comparable to or exceeding a time constant for charging the bit line ("pre-charge pulse"). The present invention can precede the read cycle with a voltage shift on inactive word lines, whereby the non-addressed cells on an active bit line are subjected to a voltage bias equal to that occurring due to the active bit line voltage shift during the read cycle. The voltage shift on the inactive word lines starting at a selected time preceding said the voltage shift on the active bit line, and terminate at the time when the latter voltage shift is initiated, in such a way that a perceived voltage bias on said non-addressed cells on the active bit line is continuously applied from the time of initiation of the voltage shift on the inactive word lines, up to the time of termination of said voltage shift on the active bit line ("pre-charge pulse").

Additionally, the present invention can apply a pre-read reference cycle which precedes the read cycle and is separated from it by a selected time, and which mimics precisely the voltage pulsing protocol and current detection of said read cycle. The exception being that no voltage shift is imposed on an active word line during the pre-read reference cycle. The present invention can employ a signal recorded during the pre-read reference cycle as input data to the circuitry that determines the logic state or a data value of the addressed cell, in which case the signal recorded during the pre-read reference cycle may be subtracted from a signal recording during the read cycle.

BRIEF DESCRIPTION OF THE DRAWINGS

The basic principles of the invention and exemplary embodiments shall now be described below and with reference to the appended drawing figures, wherein.

DETAILED DESCRIPTION

The general background and the basic principles of the present invention shall now be discussed in some detail. An aspect of the present invention is to control the time-dependent voltages on all the x and y lines in the matrix in a coordinated fashion according to one of the protocols described hereinafter. These protocols ensure that no non-addressed cell (crossing point) in the matrix experiences an interline voltage exceeding a predetermined value which is well below a level at which disturbance or partial switching occurs.

Figure 1:
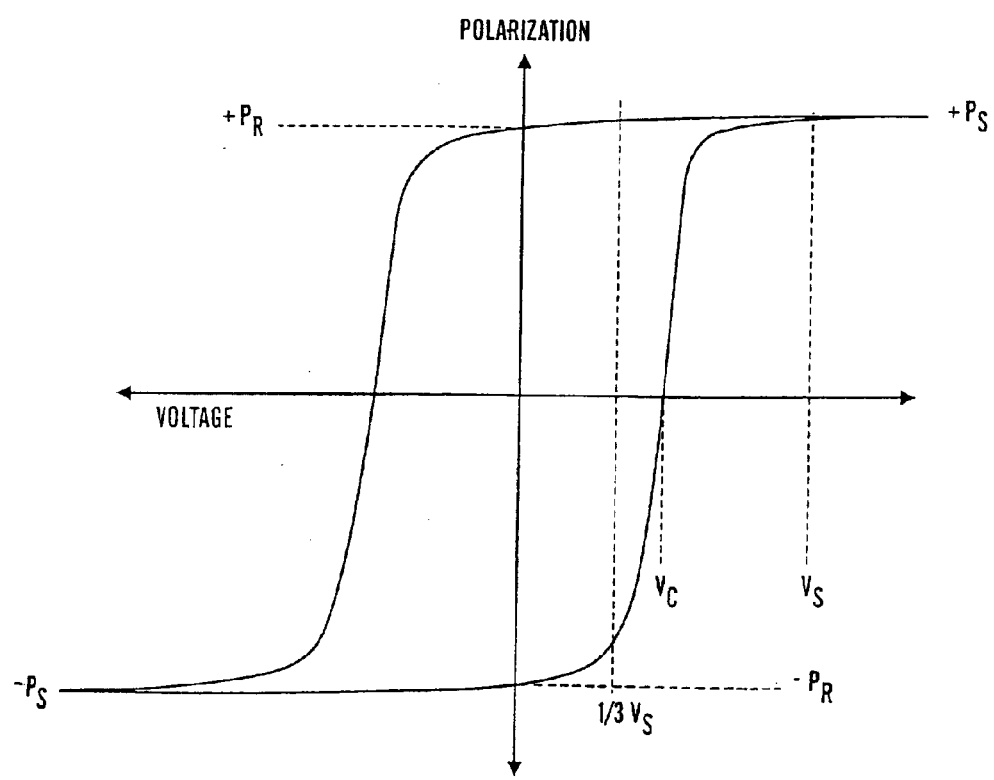
FIG. 1 shows a principle drawing of a hysteresis curve for a ferroelectric memory material, FIG. 2 a principle drawing of a passive matrix addressing arrangement with crossing electrode lines, and cells containing a ferroelectric material localized between these electrodes where they overlap.

It is understood that the materials constituting the memory function in displays and memory devices as per the instant invention exhibit hysteresis as exemplified in a generic fashion in FIG. 1. Relevant materials are electrets, ferroelectrics or a combination of the two. For simplicity, it shall be assumed in the following that the material in question is a ferroelectric, but this shall not restrict the generality of the present invention.

As a consequence of prior exposure to electric fields, the material is assumed to reside in one of two polarization states when in zero external field, represented by the points $+P_R$ and $-P_R$ in FIG. 1. Application of a voltage across the cell containing the ferroelectric causes the latter to change its polarization state, tracing the hysteresis curve in a manner well known to the person skilled in the art of ferroelectrics. For convenience, the hysteresis curve in FIG. 1 is shown with the voltage rather than the field along the abscissa axis.

Below shall be described how, in a passive matrix configuration, voltages can be applied to the crossing word- and bit lines in such a fashion that a single, freely chosen cell in the matrix experiences a potential difference $V_s$ between the two electrodes crossing at that point which has sufficient magnitude to cause the ferroelectric to switch its polarization direction in either positive or negative direction (depending on the polarity of the applied field between the electrodes) and ending up at one of the points $+P_R$ or $-P_R$ on the hysteresis curve after removal of the externally imposed field. At the same time, no other cell in the matrix shall be subjected to a potential difference that causes an unacceptable (according to prior defined criteria) change in the polarization state. This is ensured by the potential difference across non-addressed cells (the "disturbing voltage") never exceeding $+V_s/n$, where n is an integer or non-integer number of typical value of 2 or more.

Depending on the required switching speed, etc, the nominal switching voltage $V_s$ employed for driving the polarization state of the ferroelectric is typically selected considerably larger than the coercive voltage $V_C$ (cf. FIG. 1). However, it cannot be chosen arbitrarily large, since the pulsing protocols described here shall only reduce the disturbing voltage to a certain fraction (typically ⅓) of $V_s$, which level should be less than $V_C$.

Figure 2:
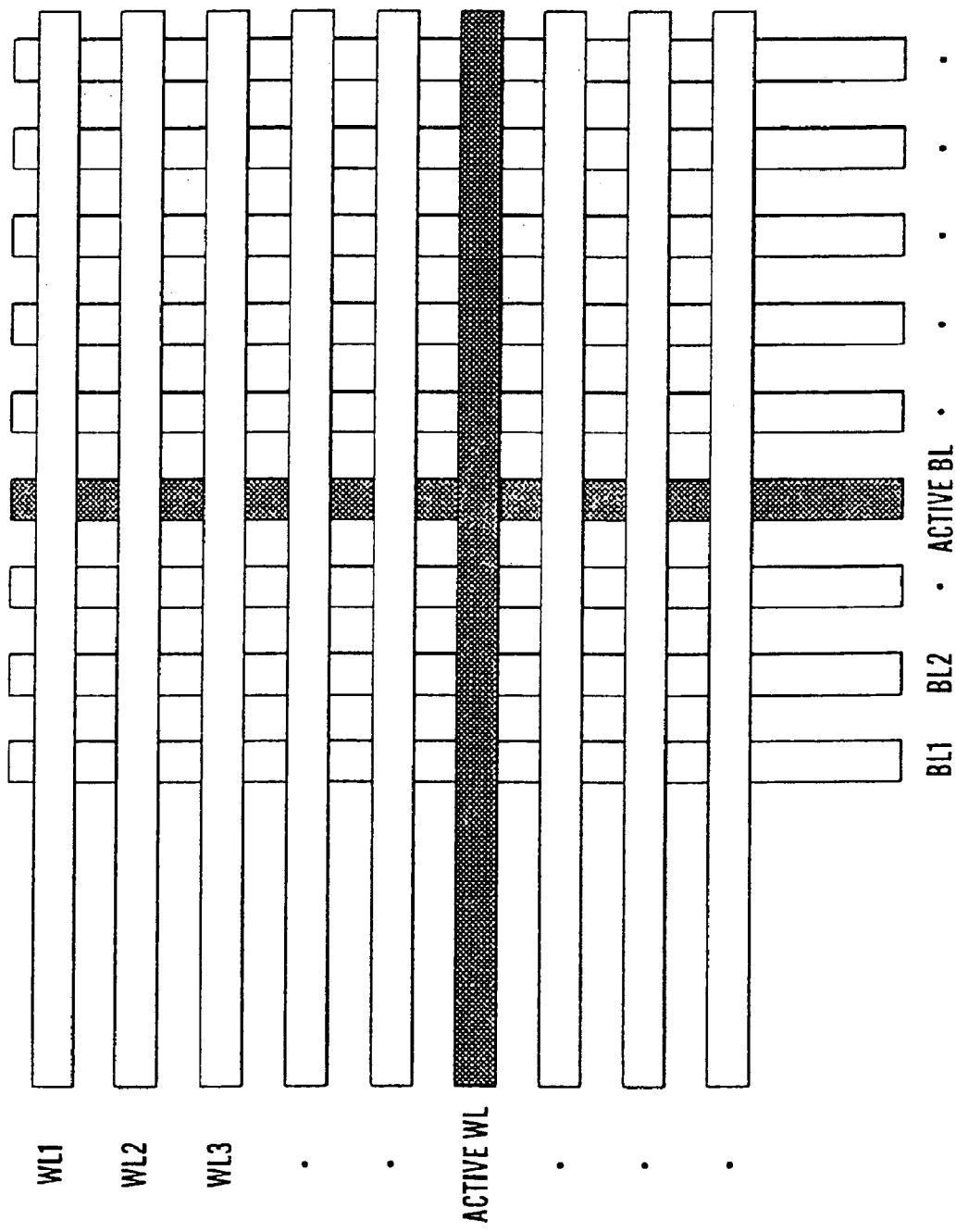

Before proceeding to a discussion of specific pulsing protocols, it may be useful to review the problem in a generalized fashion, with reference to the matrix shown in FIG. 2. For easy reference and to conform with standard usage, it is henceforth referred to the horizontal (row) and vertical (column) lines as "word lines" (abbreviated: WL) and "bit lines" (abbreviated: BL), respectively, as indicated in the figure. It is desired to apply a voltage that is sufficiently high to switch a given cell, either for defining a given polarization direction in that cell (writing), or for monitoring the discharge response (reading). Accordingly, the cell is selected by setting the potentials of the associated word and bit lines (the "active" lines) such that:

$$\Phi_{activeBL} - \Phi_{activeWL} = V_s \quad (1)$$

Figure 3:
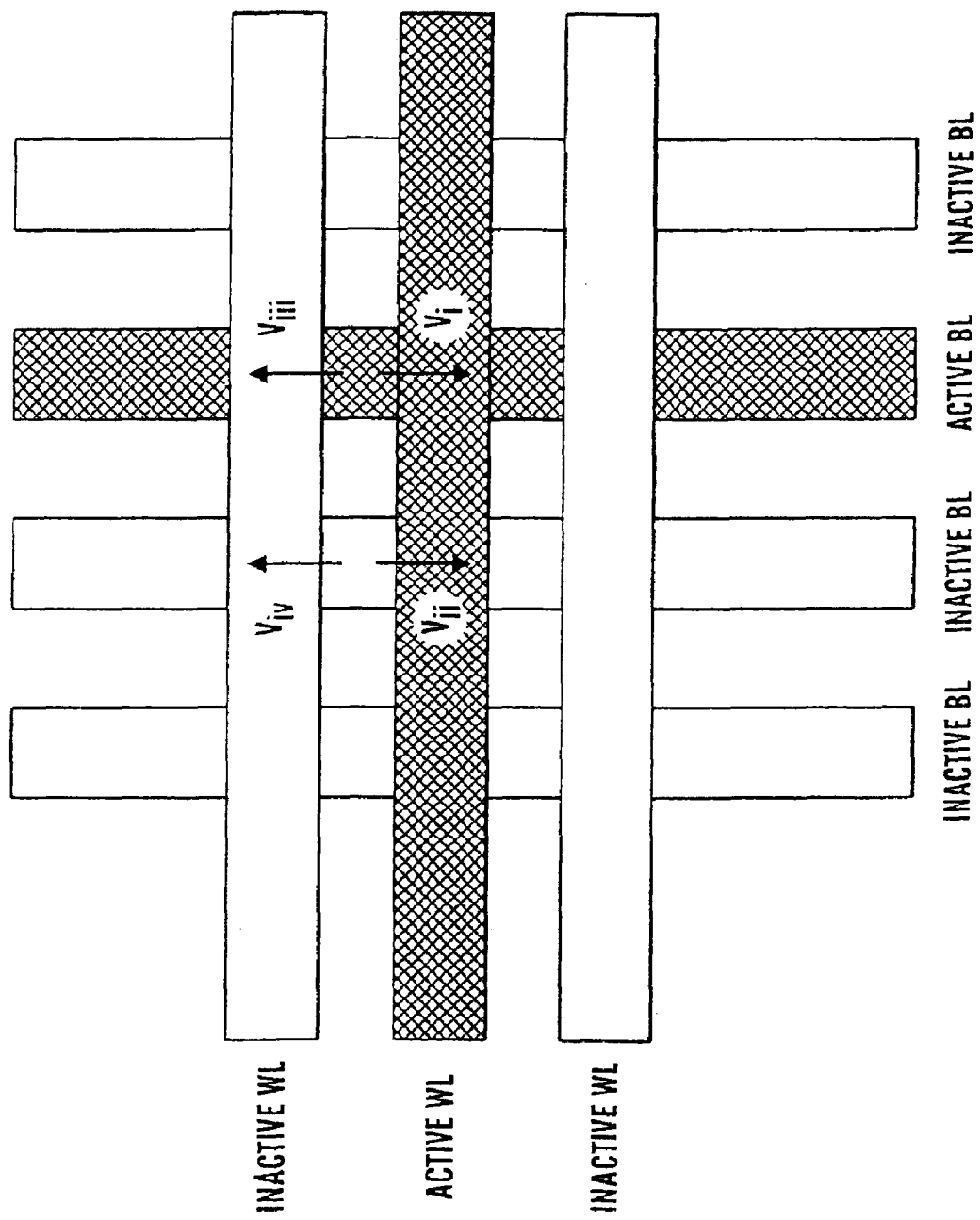
FIG. 3 the sum of voltage steps around a closed loop in the matrix.

At the same time, the numerous word- and bit lines that cross at non-addressed cells must be controlled in potential such that the disturbing voltages at these cells are kept below the threshold for partial switching. Each of these "inactive" word- and bit lines cross the active bit- and word line at a non-addressed cell. Referring to FIG. 2, one notes that four distinct classes of cells can be defined in the matrix, according to the perceived voltages across the cells:

i) $V_i = \Phi_{activeBL} - \Phi_{activeWL}$: Active word line crossing active bit line (the selected cell)

ii) $V_{ii} = \Phi_{inactiveBL} - \Phi_{activeWL}$: Active word line crossing inactive bit line iii) $V_{iii} = \Phi_{activeBL} - \Phi_{inactiveWL}$: Inactive word line crossing active bit line iv) $V_{iv} = \Phi_{inactiveBL} - \Phi_{inactiveWL}$: Inactive word line crossing inactive bit line In practical devices where it is desired to minimize cost and complexity, it is of primary interest to focus on the special case where all inactive word lines are at a common potential $\Phi_{inactiveWL}$, and correspondingly all inactive bit lines are at a common potential $\Phi_{inactiveBL}$. By summing voltages around a closed loop in the matrix grid as shown in FIG. 3, the following condition applies:

$$V_i = V_{ii} + V_{iii} - V_{iv} \quad (2)$$

Given the value of $V_i = V_s$, the minimum voltage value attainable across the non-addressed cells is thus:

$$|V_{ii}| = |V_{iii}| = |V_{iv}| = V_s/3 \quad (3)$$

To achieve this, at least four separate potentials (i.e. $\Phi_0$, $\Phi_0 + V_s/3$, $\Phi_0 + 2V_s/3$, $\Phi_0 + V_s$; where $\Phi_0$ is a reference potential) must be imposed on the electrodes in the matrix, and any change in potential on one of the electrodes must be coordinated with adjustments in the other potentials such that no cell experiences a voltage exceeding $V_s/3$. In practice, several other factors must be heeded also, e.g. related to minimizing switching transients (charge/discharge currents) and reducing the complexity of the driving circuitry, resulting in pulsing protocols such as those described below. One example is an overall shift in potentials by adding or subtracting the same voltage to all four levels.

EXAMPLE 1

Three-Level ($V_s/2$) Switching Protocol

In certain special cases, a simplified pulsing protocol may be used, where all inactive word and bit lines are given the same potential, i.e. $V_{iv}=0$. In that case, the minimum voltage value attainable across non-addressed cells becomes:

$$V_{ii}=V_{iii}=V_s/2 \qquad (4)$$

and at least three separate potentials are needed for managing the write and read operations (i.e. ($\Phi_0$, $\Phi_0+V_s/2$, $\Phi_0+V_s$; where $\Phi_0$ is a reference potential).

As was mentioned above, partial switching may represent a serious problem at voltage levels of $V_s/2$, rendering three-level protocols unacceptable. However, the degree of partial switching at a given applied voltage depends explicitly on the ferroelectric material in question. Referring to FIG. 1, materials with a square shaped hysteresis curves shall in many applications yield acceptable performance.

Recently, certain classes of ferroelectrics such as organic polymers have received much attention as memory substances in advanced data storage concepts. In addition to other attractive features, theses materials exhibit hysteresis curves far more square shaped than those of the ceramic ferroelectrics that have traditionally dominated developments in the field of ferroelectric-based non-volatile memory devices. Thus, it has become relevant to define pulsing protocols which can satisfy the requirements of realistic and optimized electronic device designs. Following upon the partial switching problems that discouraged development and exploitation of early efforts based on three-level switching protocols, these aspects have received very little attention, which the present invention sets out to remedy.

Now examples of preferred embodiments shall be given.

Figure 4:
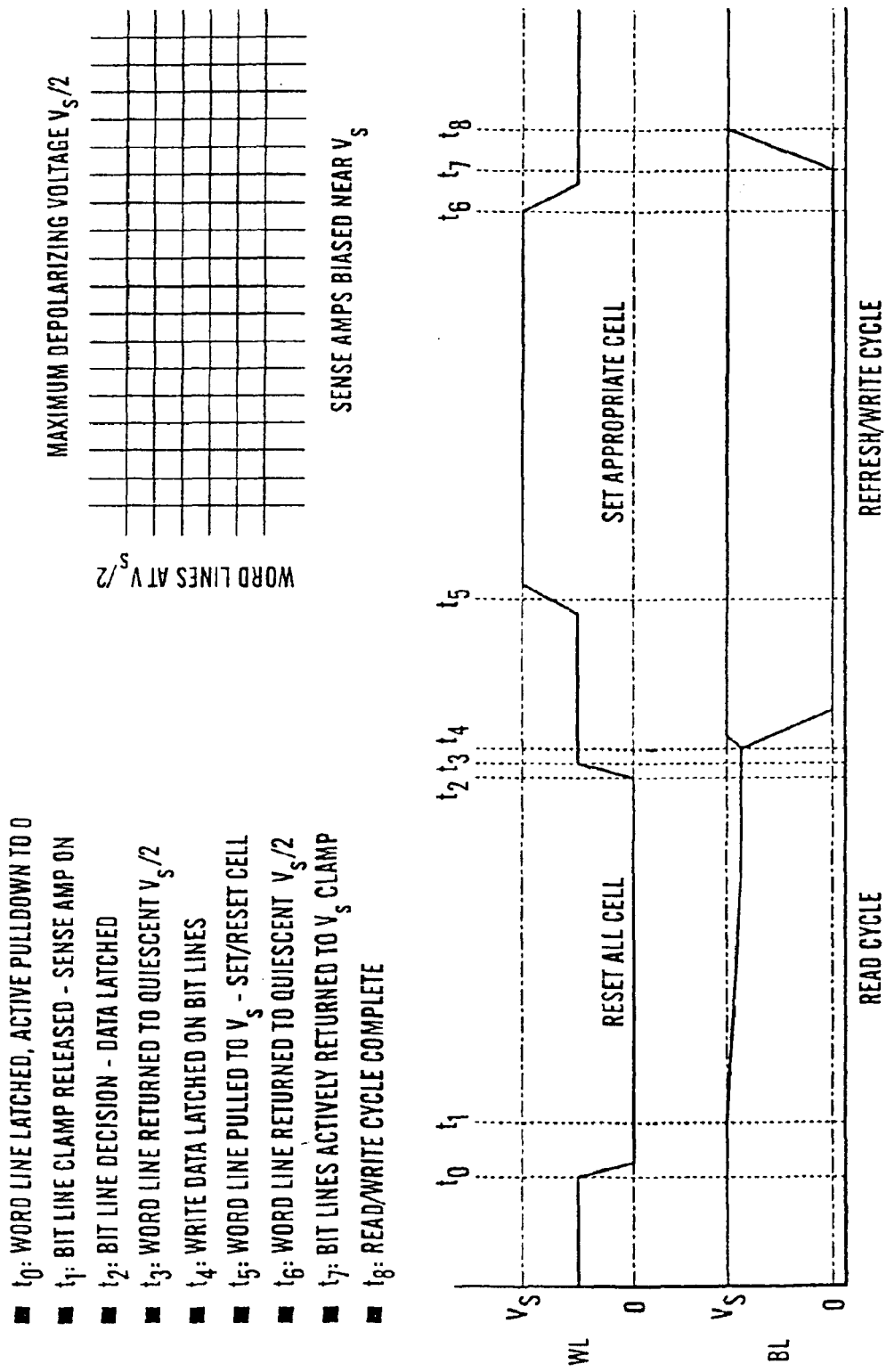
FIG. 4 a read and write voltage protocol requiring three separate voltage levels to be controlled on the word- and bit lines, FIG. 5 an alternative variant of the three level voltage protocol in FIG. 4, FIG. 6 a read and write voltage protocol requiring four separate voltage levels to be controlled on the word- and bit lines, FIG. 7 an alternative variant of the four level voltage protocol in FIG. 6, FIG. 8 a read and write voltage protocol requiring five separate voltage levels to be controlled on the word- and bit lines, FIG. 9 an alternative variant of the five level voltage protocol in FIG. 8, FIGS. 10–13 alternative voltage protocols to those shown in FIGS. 6–9, the difference being that pre-charging pulses on inactive word lines are now included, FIG. 14 an example of a read and write protocol involving a pre-read reference cycle, and FIG. 15 a readout scheme based on full row parallel detection.
Figure 5:
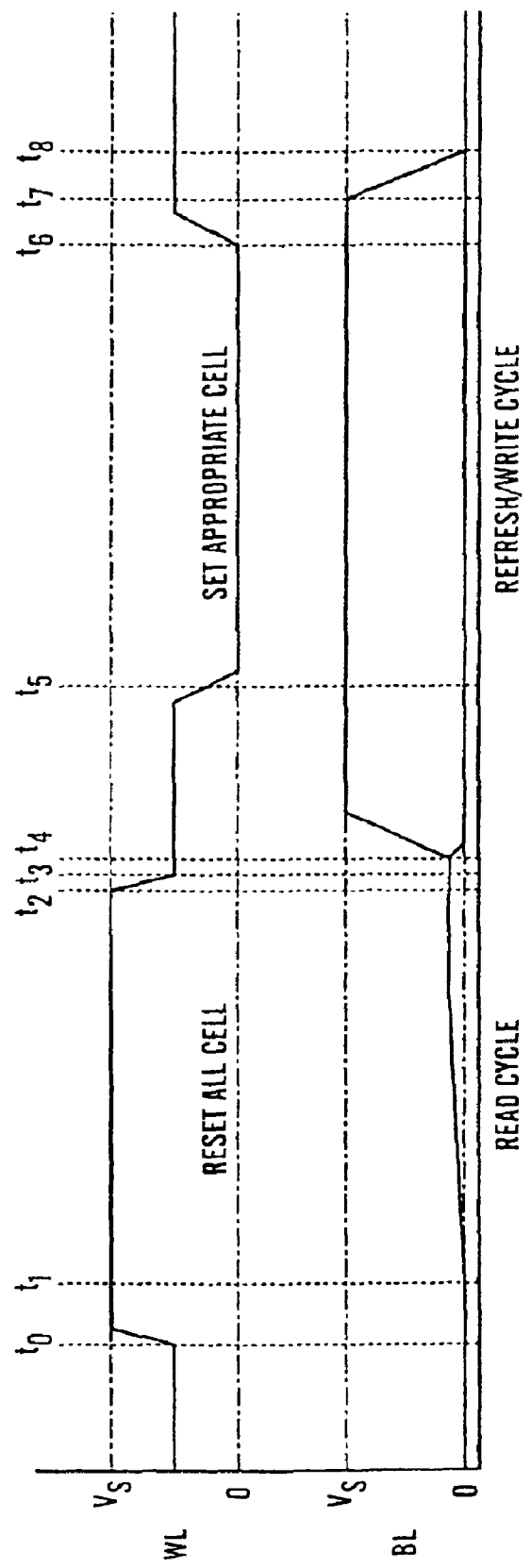

FIGS. 4 and 5 illustrate some three-level pulsing protocols according to the present invention, comprising a complete read cycle and a refresh/write cycle. Only the pulse diagrams for the active word- and bit lines are shown. The inactive word lines may be kept stable at $V_s/2$ throughout the read/write cycle, as may the inactive bit lines. Alternatively, the latter may during the read cycle each be connected with a separate sense amplifier, which would be biased near the bit line voltage when the bit line clamp is released (full row readout). In the diagrams shown in FIGS. 4 and 5, the time markers are as follows:

$t_0$: Word line latched, active pulldown to 0 (FIG. 4) or pullup to $V_s$ (FIG. 5)

$t_1$: Bit line clamp released—sense amplifier ON $t_2$: Bit line decision—data latched $t_3$: Word line returned to quiescent $V_s/2$ $t_4$: Write data latched on bit lines $t_5$: Word line pulled to $V_s$ (FIG. 4) or zero (FIG. 5)—set/reset capacitors $t_6$: Word line returned to quiescent $V_s/2$ $t_7$: Bit lines actively returned to $V_s$ (FIG. 4) or zero (FIG. 5) clamp $t_8$: Read/write cycle complete The read cycle investigates the state of the polarization of the addressed cell. Depending on the polarization direction, the read operation may leave the polarization unchanged, or it may reverse the polarization direction (destructive read). In the latter case, the information must be refreshed if it is desired avoid loss of stored data. This implies that the polarization must be driven in the opposite direction of the read operation in an appropriate cell (not necessarily the one that was read) somewhere in the matrix. This is achieved by the part of the protocol dedicated to refresh/write, as shown. The two branches in the bit line voltage protocol correspond to the cases where the polarization is left unchanged and reversed, respectively. An isolated write operation is trivially achieved by omitting the preceding read operation.

As shown in FIGS. 4 and 5, it is clear that non-addressed cells shall not receive voltages exceeding ½ of the nominal switching voltage, neither during reading or refresh/writing periods. In addition, one notes that there are included event delays in the pulsing sequence to facilitate transient ringdown and latching of data. Depending on how the memory device is to be operated, the bit line potential in the quiescent state (i.e. between read/refresh/write cycles) may be chosen to match that of the bit line at the start of the read cycle (cf. FIGS. 4 and 5) or it may match the quiescent potential of the word line (not shown here). In the former case, appropriate when cycling is intense and at high speed, charging currents at the start of the read cycle are minimized. In the latter case, long-term effects of an imposed field in the cells (e.g. imprint) are avoided.

It should be clear that the examples shown in FIGS. 4 and 5 may be modified (e.g. by concurrent shifting of all potentials, or by minor departures from exact voltage levels in the three-level scheme shown) without departing from the essential principles illustrated therein.

EXAMPLE 2

Four-Level ($V_s/3$) Switching Protocol

Figure 6:
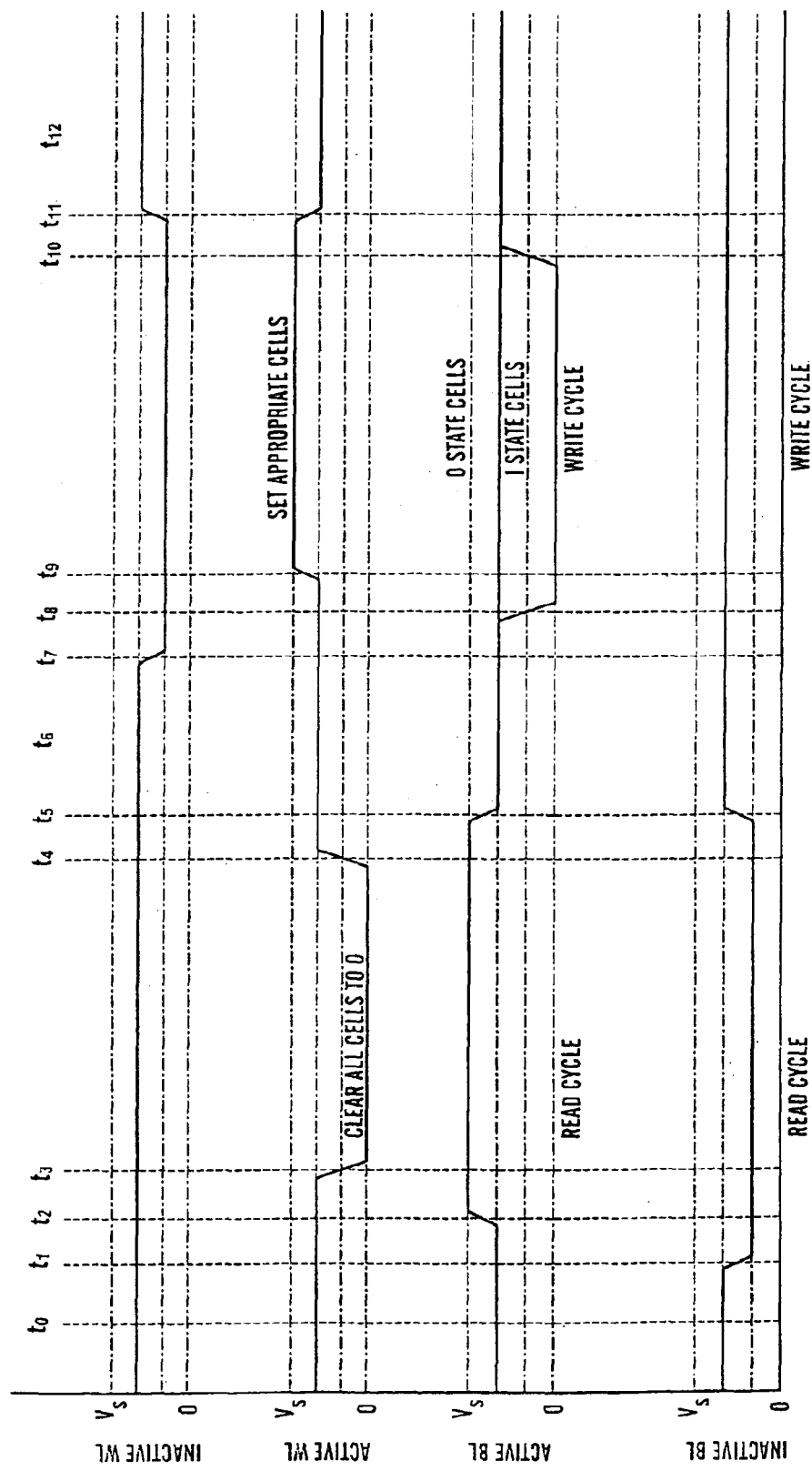
Figure 7:
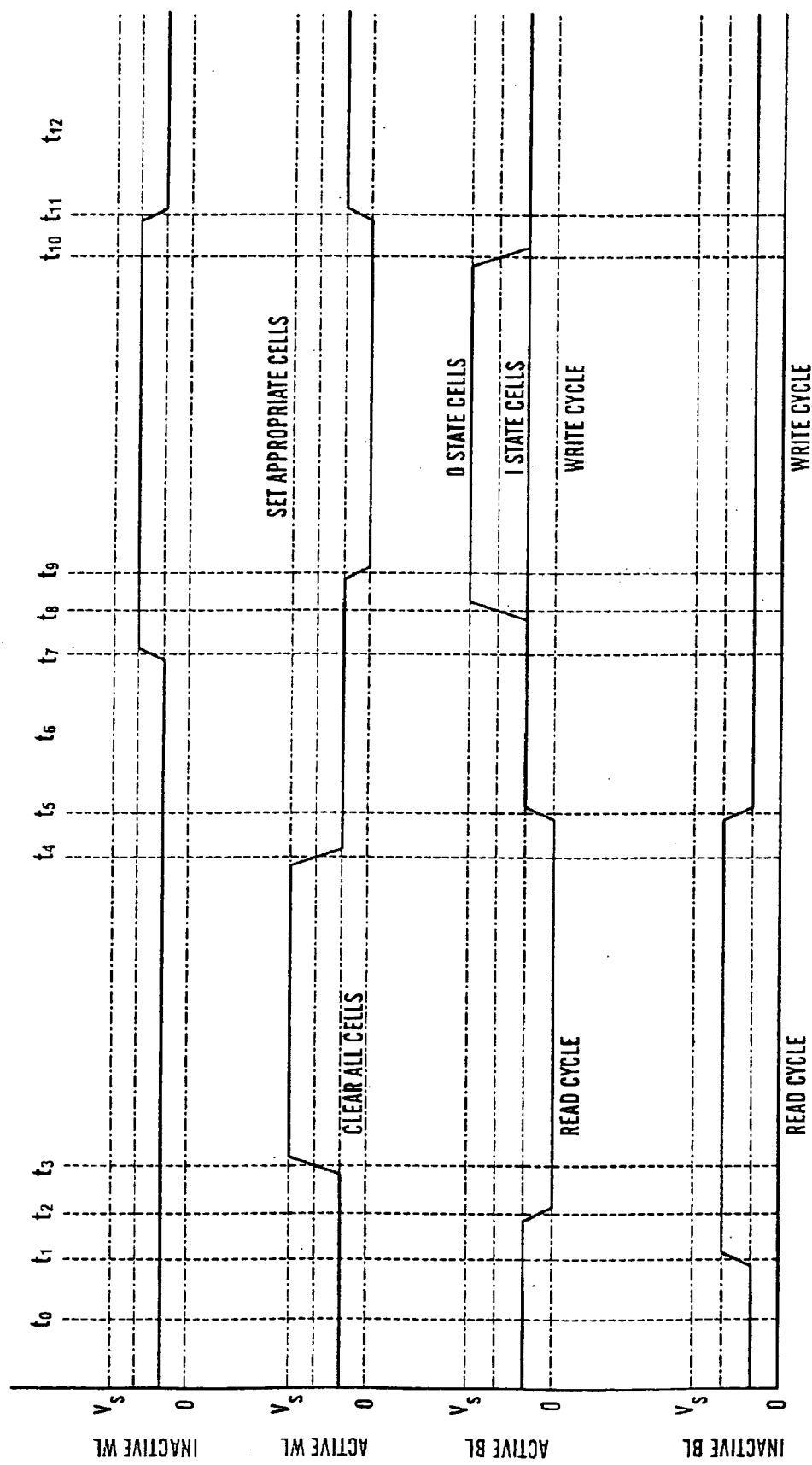

As described above, by employing at least 4 different potential levels on the word and bit lines, one can ensure that no non-addressed cell experiences a voltage exceeding ⅓ of the nominal switching voltage. FIGS. 6 and 7 illustrate two variants of a preferred scheme for reading as well as refreshing/writing data, according to the present invention. Here, the time markers are as follows:

$t_0$: Quiescent state; all word- and bit lines at $2V_s/3$ (FIG. 6) or $V_s/3$ (FIG. 7)

$t_1$: Inactive bit lines adjusted from quiescent value to $V_s/3$ (FIG. 6) or $2V_s/3$ (FIG. 7)

$t_2$: Addressed bit line(s) adjusted to $V_s$ (FIG. 6) or 0 (FIG. 7). Time delay from $t_1$ to $t_2$ is arbitrary; zero or negative timings are acceptable also $t_3$: After a programmable read-set up delay, the addressed word line is adjusted from quiescent potential to 0 V (FIG. 6) or $V_s$ (FIG. 7), a voltage of magnitude $V_s$ between addressed word and bit lines. Unaddressed word lines remain at $2V_s/3$ (FIG. 6) or $V_s/3$ (FIG. 7)

$t_4$: Addressed word line returned to quiescent potential after read delay $t_5$: All bit lines returned to quiescent potential $t_6$: Read cycle now complete. All word- and bit lines in quiescent state ($2V_s/3$ in FIG. 6; $V_s/3$ in FIG. 7)

$t_7$: All inactive word lines adjusted from quiescent to $V_s/3$ (FIG. 6) or $2V_s/3$ (FIG. 7)

$t_8$: Addressed bit line(s) to be written to logic state "1" are adjusted to 0 V or are left at quiescent potential to remain in logic "0". (FIG. 6) Addressed bit line(s) to be written to logic state "0" are adjusted to $V_s$ or are left at quiescent potential to remain in logic "1" (FIG. 7)

$t_9$: Addressed word line is adjusted to $V_s$ (FIG. 6) or 0 (FIG. 7), introducing a voltage of magnitude $V_s$ across addressed cell(s)

$t_{10}$: Addressed bit line(s) returned to quiescent $2V_s/3$ (FIG. 6) or $V_s/3$ (FIG. 7) after write delay $t_{11}$: All word lines returned to quiescent potential $t_{12}$: Write cycle complete. All word- and bit lines in quiescent Apart from the increased voltage level complexity, the basic features are similar to those referred above in connection with the three level schemes. Now, however, no non-addressed cell is exposed to a voltage exceeding $V_s/3$ in the course of a complete read/write cycle, which shall cause only minor partial switching in most ferroelectric materials of relevance here. Again, several variants on a common theme are possible. Thus, FIGS. 6 and 7 show a return to zero applied voltage across all cells in the quiescent state (cf. the above discussion under the three-level switching protocol), which corresponds to word and bit line potentials of $2V_s/3$ or $V_s/3$, whereas other potential levels on the word- and bit lines are possible in the quiescent state that either yield zero voltages across the cells or voltages of absolute value $\leq |V_s|/3$. Such variants shall be assumed obvious to the skilled person and shall not be pursued in further detail here.

The timing diagrams in FIGS. 6 and 7 are equivalent in principle, one being an "inverted" version of the other. In practice, however, one may be preferred over the other. Thus, the scheme shown in FIG. 6 implies a voltage at the sense amplifier input during the read cycle near $V_s$. In the scheme of FIG. 7, however, the voltage is near zero. This may permit the use of low voltage components with a single high voltage pass transistor per bit line.

EXAMPLE 3

Five-Level ($V_s/3$) Switching Protocol

Figure 8:
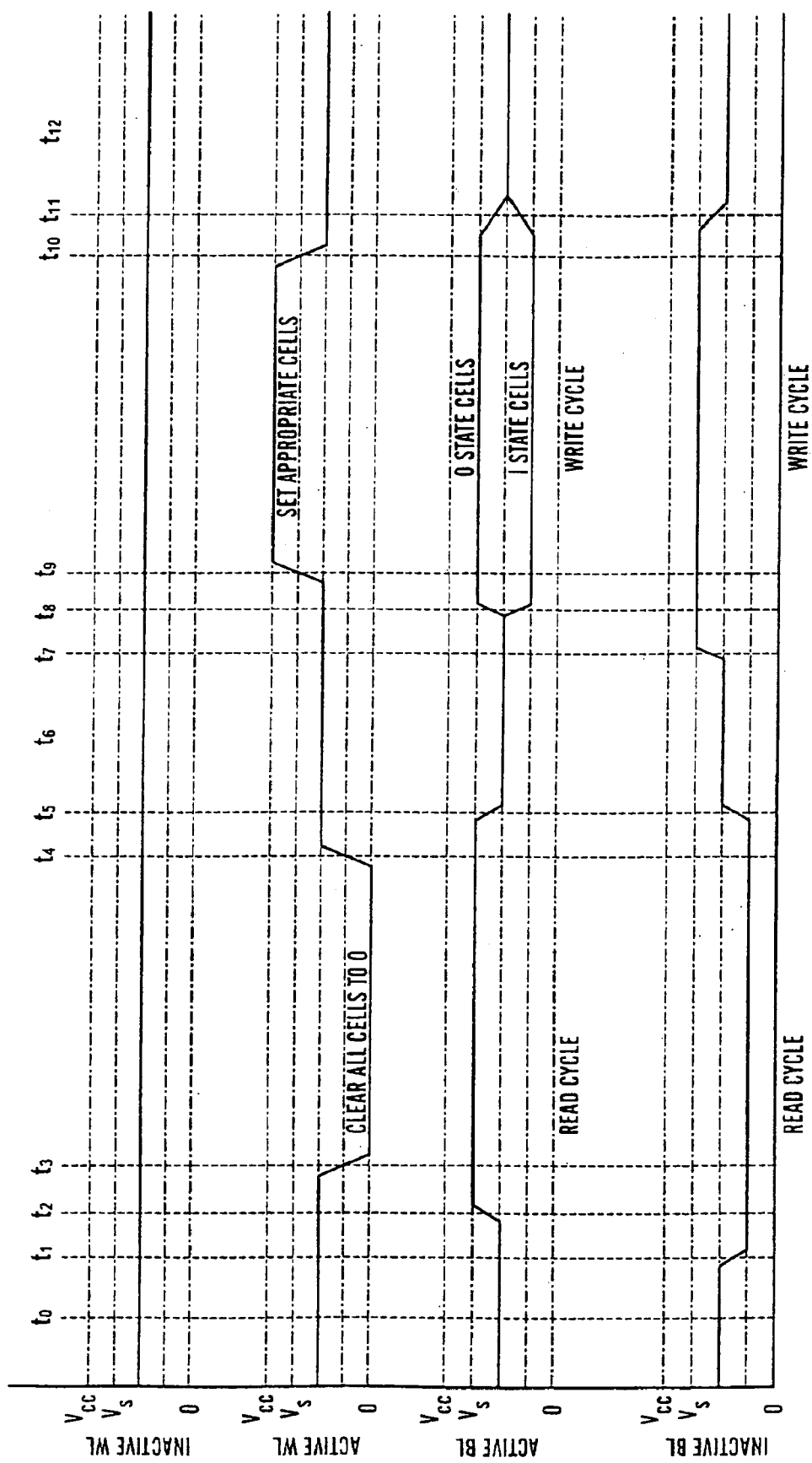
Figure 9:
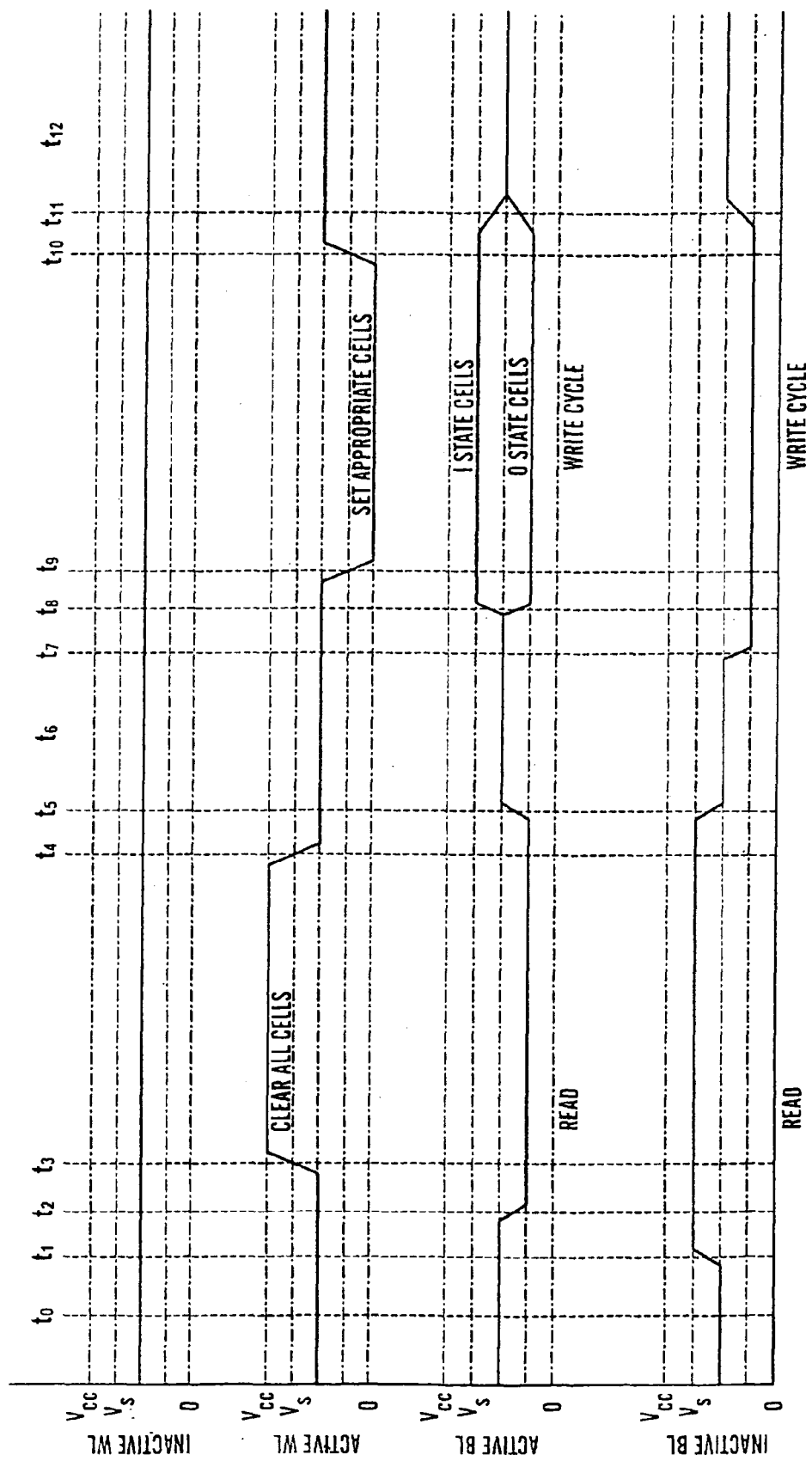
Figure 10:
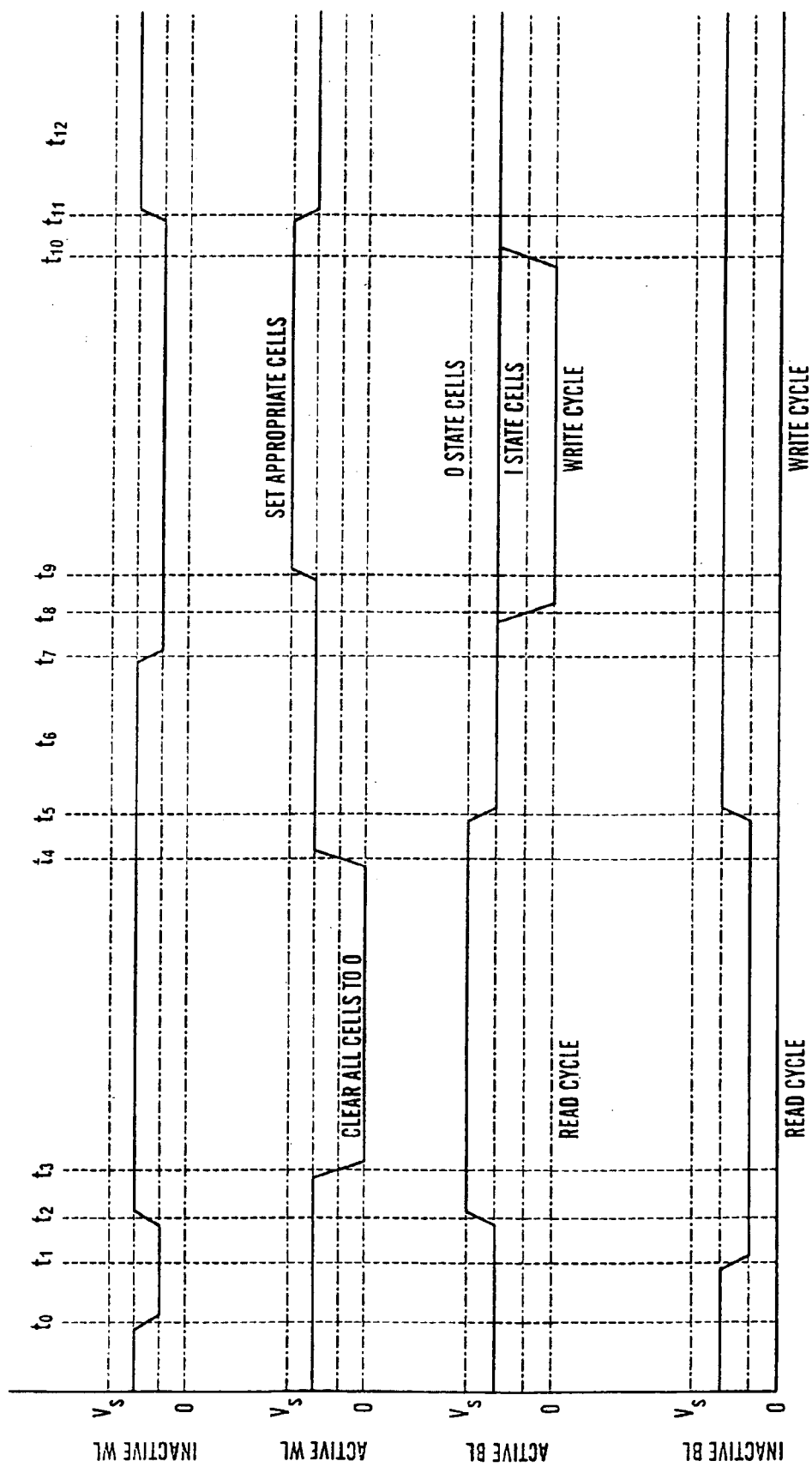
Figure 11:
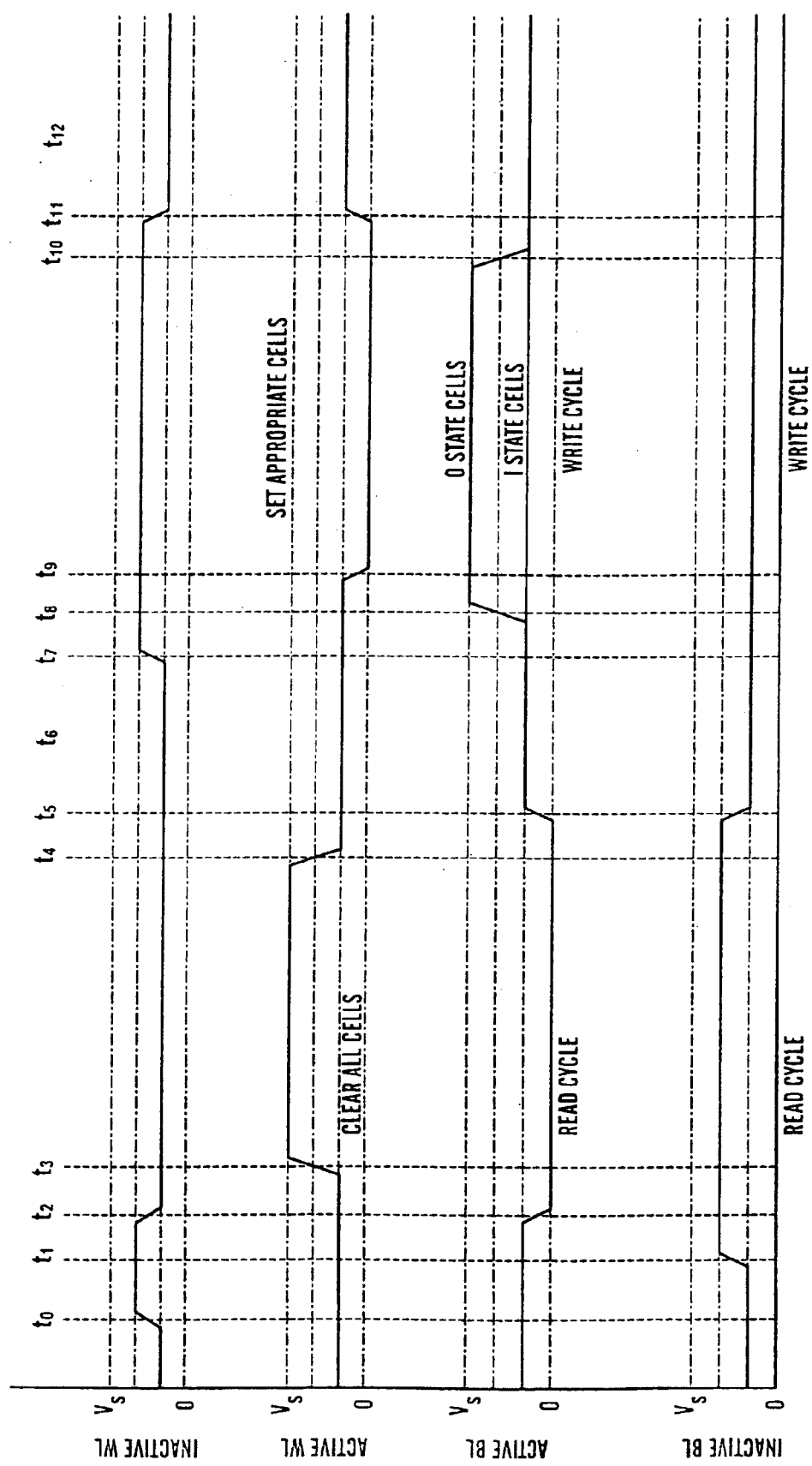
Figure 12:
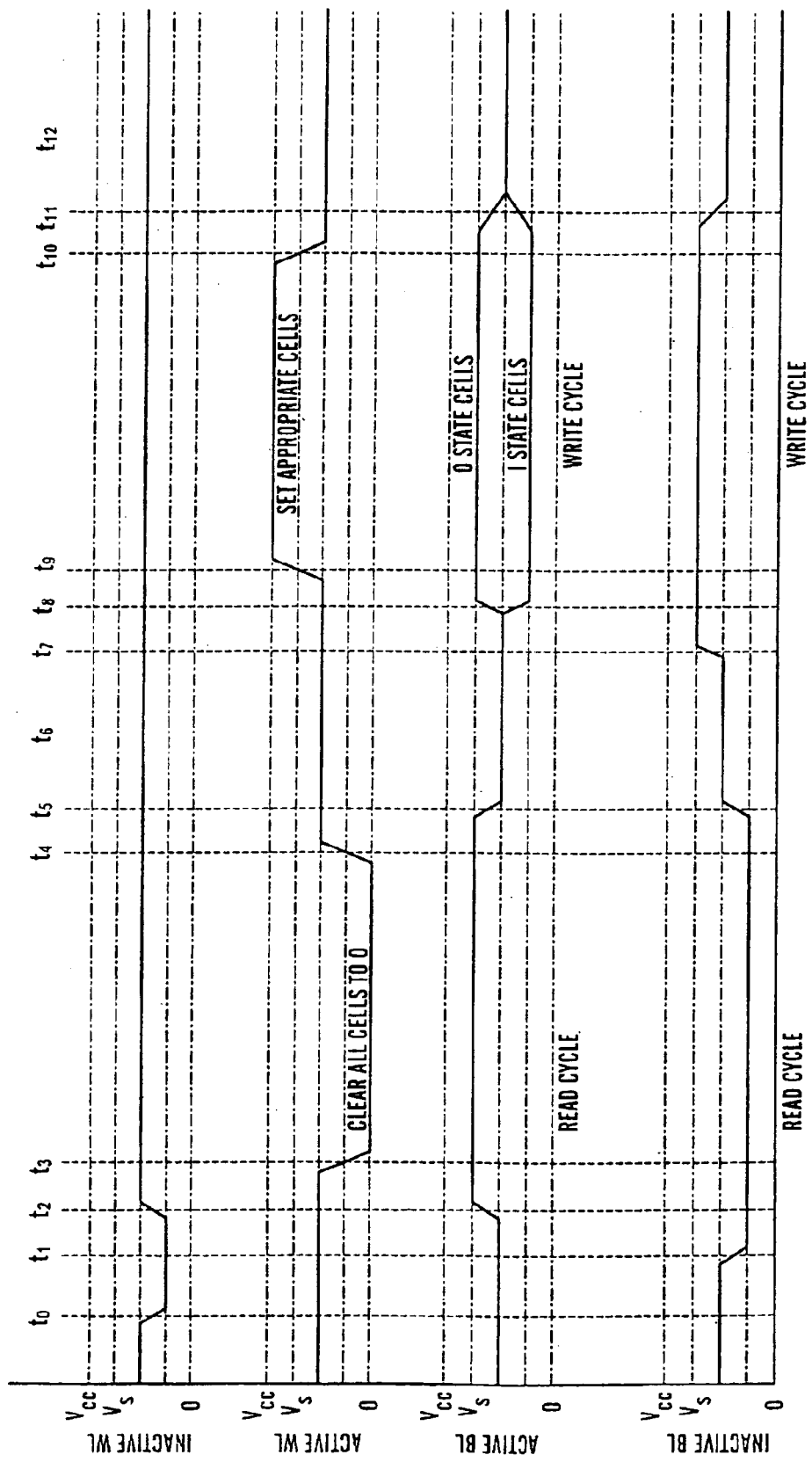
Figure 13:
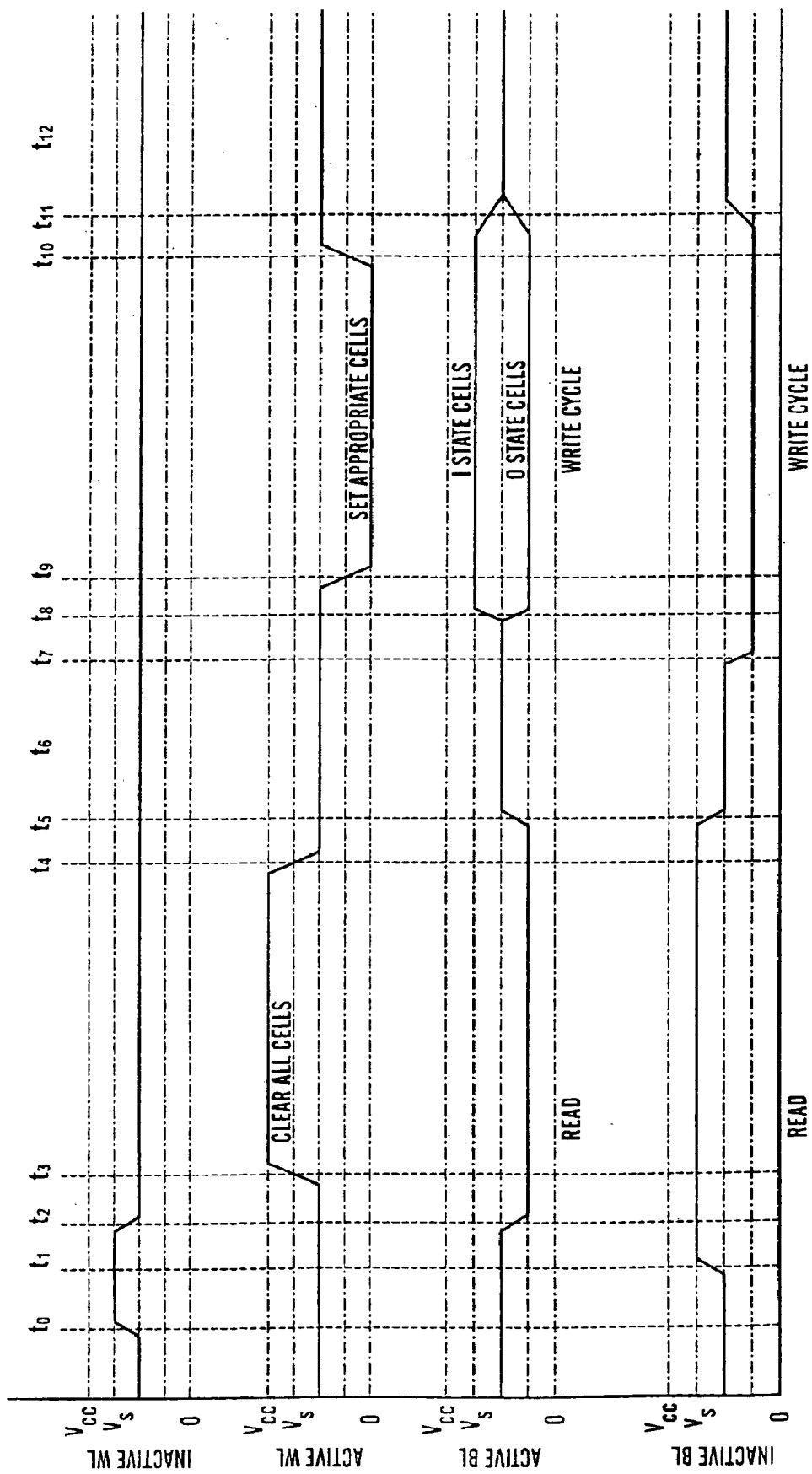

A class of seemingly more complex, but in certain respects more simply implemented pulsing protocols involve the application of five different potential levels to the word- and bit lines during a complete read/write cycle. Explicit examples of two preferred embodiments are shown in FIGS. 8 and 9. The time markers are as follows:

$t_0$: Quiescent state: all word- and bit lines at $2V_s/3$ (FIG. 8) or $V_s/3$ (FIG. 9)

$t_1$: Inactive bit lines adjusted from quiescent value to $V_s/3$ (FIG. 8) or $2V_s/3$ (FIG. 9))

$t_2$: Addressed bit line(s) adjusted to $V_s$ (FIG. 8) or 0 (FIG. 9)). Time delay from $t_1$ to $t_2$ is arbitrary; zero or negative timings are acceptable also $t_3$: After a programmable read-set up delay, the addressed word line is adjusted from quiescent potential to 0V (FIG. 8) or $4V_s/3$ (FIG. 9), inducing a voltage of magnitude $V_s$ between addressed word and bit lines. Unaddressed word lines remain at $2V_s/3$ (FIG. 8) or $V_s/3$ (FIG. 9)

$t_4$: Addressed word line returned to quiescent potential after read delay $t_5$: All bit lines returned to quiescent potential $t_6$: Read cycle now complete. All word and bit lines in quiescent state ($2V_s/3$ in (FIG. 8); $V_s/3$ in (FIG. 9)

$t_7$: Inactive bit lines adjusted from quiescent to $V_s$ (FIG. 8) or $V_s/3$ (FIG. 9)

$t_8$: Addressed bit line(s) to be written to the "1" state are adjusted to $V_s/3$, while those that shall remain in state "0" are adjusted to $V_s$ (FIG. 8); addressed bit line(s) to be written to the "0" state are adjusted to $V_s/3$, while those that shall remain in state "1" are adjusted to $V_s$ (FIG. 9)

$t_9$: Addressed word line is adjusted to $4V_s/3$ (FIG. 8) or 0 (FIG. 9), introducing a voltage of magnitude $V_s$ across addressed cell(s). Non-addressed word lines remain at $2V_s/3$ $t_{10}$: Addressed word lines returned to quiescent potential after write delay $t_{11}$: All bit lines returned to quiescent potential $t_{12}$: Write cycle complete. All word and bit lines in quiescent Here, a fifth voltage level, $V_{CC}$, is involved. It is typically of magnitude $4V_s/3$, and is applied to the active word line during the reading (FIG. 9) or refresh/write (FIG. 8) cycle. One notes that while the four-level schemes in FIGS. 6 and 7 require all word and bit lines to be driven at four levels in the course of the complete read/write cycle, the five-level schemes in FIGS. 8 and 9 require only three separate voltage levels to be applied to the word lines and three separate but not identical voltage levels to be applied to the bit lines. This provides opportunities for optimization and simplification of the driving and sensing electronics supporting the device. Further simplification can be realized by choosing $4V_s/3 = V_{CC}$ close to the power supply voltage.

EXAMPLE 4

Switching Protocols Involving Pre-Charging of Non-Addressed Cells on Active Bit Lines So far, primary focus has been on avoiding partial switching of non-addressed cells. However, it is also desirable to design switching protocols that simultaneously minimize the effect of parasitic current flows within the memory matrix during the read cycle:

In memory matrices based on passive matrix addressing, the area data storage density is maximized by using matrices that are as large as possible. This implies that each matrix should contain the largest possible number of crossing points between word and bit lines, and any given bit line must consequently cross a large number of word lines. When a given word and bit line crossing is selected, the large number of non-selected crossing points between the bit line and all of the non-selected crossing word lines constitute a correspondingly large number of parasitic current leakage paths (capacitive, inductive, ohmic) which may add up to slow down the device and reduce the contrast ratio of as-read logic "1"s and "0"s.

One method of reducing the effect of parasitic currents on the determination of logic states is to pre-charge the non-addressed cells on the active bit line to a level corresponding to that which would be approached during the reading of the active cell. This procedure is implicit in the voltage protocols shown in FIGS. 6–9. At time point 2, i.e. prior to applying the read voltage step to the active word line (at time point 3 in the figures) the active bit line voltage is shifted to its read cycle value, creating a voltage bias between the active bit line and all word lines. This initiates the spurious current flows in all the non-active cells on the active bit line. These currents are typically transient, reflecting polarization phenomena in the cells, and die out or are greatly diminished after a short time. Thus, by making the time gap between time points 2 and 3 sufficiently long, the spurious current contributions to the switching currents sensed during the reading cycle are greatly diminished. Certain limitations adhere to this scheme: If the time gap between time points 2 and 3 becomes very long, it has obvious implications on the data access speed and overall read cycle time. Additionally, the cumulative effect of repeated cycling with long pre-charging times may be to cause partial switching and imprint, which was sought avoided by having zero voltage across all cells in the quiescent state.

The voltage protocol diagrams in FIGS. 6–13 do not show the sense amplifier timing, which may vary from case to case, depending upon the dynamics of the polarization switching and spurious current response in the addressed and in the non-addressed cells. The sense amplifiers must be activated after time point 2 to avoid the spurious current transient from the non-addressed cells, and not much later than time point 3 in order to capture any polarization reversal current in active cells that are switched by the read cycle.

One notes that by advancing the time point 2 well ahead of time point 3, not only the inactive cells on the active bit line are subjected to an early voltage bias of magnitude $|V_s/3|$, but also the active cell. Thus, some of the switching charge in the active cell is drained away before the sense amplifier has been connected. The magnitude of this effect, which is undesirable since it reduces the read signal, depends on the polarization characteristics of the memory material in the cells and may range from negligible to significant. In the latter case, one may implement a slight modification of the voltage protocol by introducing a voltage shift on the inactive word lines as illustrated in FIGS. 10–13. The leading edge of the shift occurs at time point 0, and the trailing edge coincides with the leading edge of the active bit line voltage shift at time point 2. By precisely controlling the trailing and leading edge shifts at time point 2, the voltage across the non-addressed cells on the active bit line shall rise from zero to a magnitude $|V_s/3|$ at time point 0 and remain unchanged at this value until time point 5, i.e. after completion of the read cycle. The time point 2 may now be optimized for the readout process in the active cell, without limitations relating to driving the pre-charge transient in the non-addressed cells. As can be seen from FIGS. 10–13, the voltage across non-addressed cells is always maintained at less than a magnitude $|V_s/3|$ in these modified schemes, but 4 voltage levels are now involved on the word lines in the five-level protocols, compared to three levels previously.

EXAMPLE 5

Switching Protocols Involving a Reference Pre-Read Cycle

Another scheme for circumventing or alleviating the problems relating to parasitic currents in non-addressed cells on active bit lines shall now be described.

For concreteness, refer to, e.g. the four-level timing diagram shown in FIG. 6. The pre-charge scheme described in the above paragraphs implies that the active bit line has been shifted to its read cycle value at time point 2, and ensuing parasitic currents have been significantly reduced by the time the active word line is switched at time point 3. The logic state in the addressed cell is determined by the sense amplifier which records the charge flowing to the bit line during a defined time interval that starts near the time point 3 and stops before the time point 4.

Ideally, such pre-charge schemes shall enable detection of the charge flowing in response to the shifting of the active word line at time point 3, without interference from parasitic currents through cells at inactive word lines. In practice, the parasitic currents may die down slowly and/or have an ohmic (i.e. non-transitory) component such that some parasitic charge is captured by the sense amplifier. Although the magnitude of the parasitic current component flowing through each non-addressed cell on the active bit line may be small, the currents from hundreds or thousands of non-addressed cells on the active bit line may add up to become very significant, corrupting the readout results.

Assuming stable and predictable conditions, such a parasitic contribution may in principle be removed by subtracting a fixed amount of charge from that recorded by the sense amplifier during the reading cycle. In many instances, however, the magnitude and variability of the parasitic contribution makes this inappropriate. Thus, in addition to the manufacturing tolerances for the device, the fatigue and imprint history may vary within wide limits between different cells in the same memory device and even on the same bit line, and the parasitic current may depend strongly upon the device temperature at the time of read-out. In addition, the parasitic current associated with a given non-addressed cell on the active bit line may depend on which logic state it is in. In that case the cumulative parasitic current from all non-addressed cells on the active bit line shall depend on the set of data stored in those cells, which defies prediction.

Figure 14:
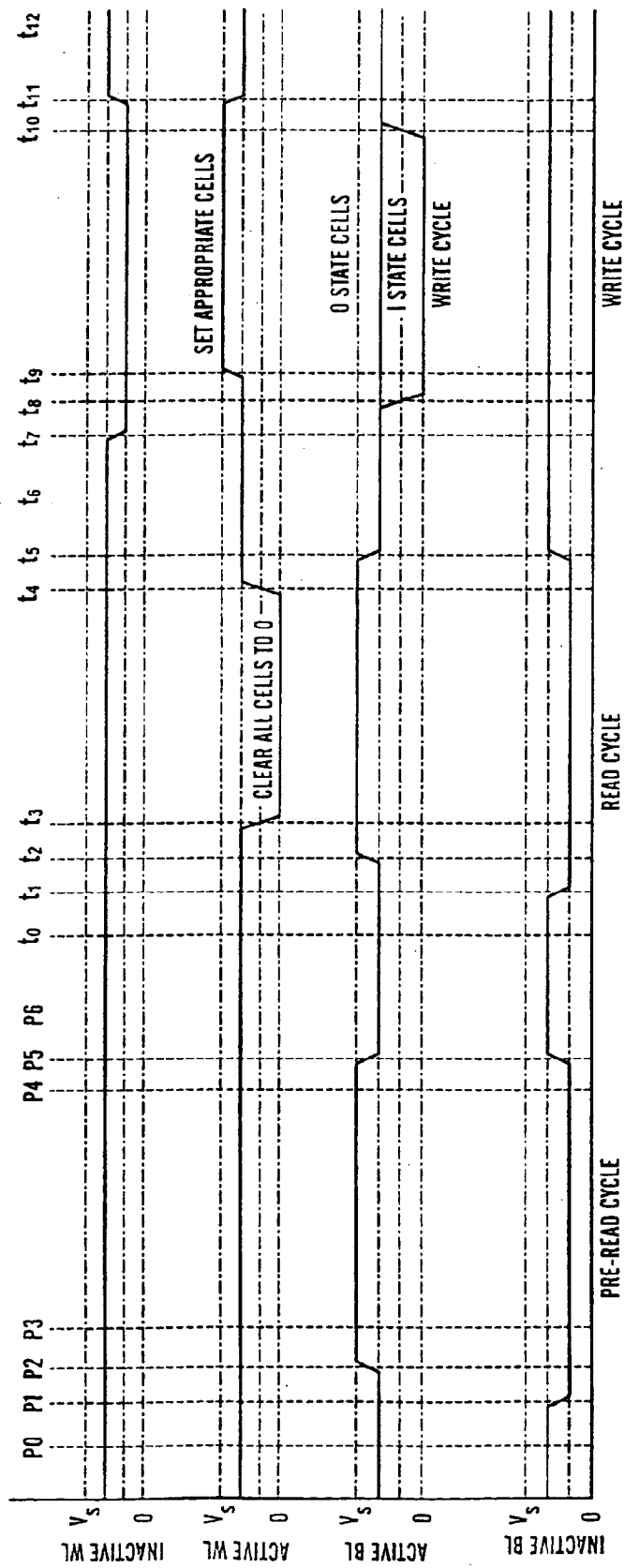

In order to obtain a true measure of the cumulative parasitic currents in connection with a given read-out event, one may implement a pre-read reference cycle as exemplified in FIG. 14.

The pre-read cycle immediately precedes the read-out cycle and differs from the latter in only one respect, namely that the active word line is not shifted at all. The sense amplifier is activated in precisely the same time slot relative to the bit line voltage shifts as is the case in the subsequent read cycle. Thus, the cumulative charge detected during the pre-read cycle shall correspond very closely to the parasitic current contributions captured during the read cycle, including contributions from the active cell. The detected charge from the pre-read cycle is stored and subtracted from that recorded during the read cycle, yielding the desired net charge from the switching or non-switching transient in the active cell.

Clearly, the effects of fatigue, imprint, temperature and logic states are automatically taken care of by this referencing scheme. An important prerequisite is that the pre-read cycle must not materially alter the parasitic current levels in the read cycle. Thus, the delay between time points P6 and 0 (cf. FIG. 14) must be sufficient for pre-read cycle transients to die down. In certain cases, two or more successive pre-read cycles may be employed to obtain a reproducible parasitic current response prior to the read cycle. However, this increases complexity and total readout time.

Inspection of FIG. 14 in conjunction with the four level pulse protocol shown in FIG. 6 shows how the pre-read reference cycle principle may be implemented for the other pulse protocols covered by the present invention, by trivial extension of the example given in the present instance.

EXAMPLE 6

Switching Protocols Involving Offset Voltages

Yet another scheme for circumventing or alleviating the problems relating to parasitic currents in non-addressed cells on active bit lines shall now be described.

According to Equation (2) above, the minimum disturbing voltage on non-addressed cells is $V_s/3$ (cf. Equation (3)) and the preferred embodiments described in conjunction with the four- and five-level switching protocols were shown to achieve this. As will be discussed below, it may in certain instances be preferable to deviate somewhat from this criterion.

Given that the memory cells exhibit certain characteristics regarding their electrical impedance and switching properties, it is possible to achieve a low parasitic current load on the bit line during read operations, while at the same time keeping disturbance of the non-addressed cells at a low level.

It is assumed that the selected cell is subjected to a voltage $V_i = V_s$ during the period when the memory material in the cell undergoes polarization switching. Thus, $$V_s = V_{ii} + V_{iii} - V_{iv} \quad (5)$$

It is desired to lower the cumulative leakage current on the active bit line which flows through the non-addressed cells on that line. This can be achieved by lowering the voltage across the non-addressed cells by an amount $\delta$. Thus, $$V_{iii} \to V_{iii} - \delta \quad (6)$$

According to (5), this increment must be compensated by a corresponding adjustment in the voltages across the remaining non-addressed cells:

$$V_{ii} - V_{iv} \to V_{ii} - V_{iv} + \delta \quad (7)$$

In a large matrix, the number of cells with inactive word and inactive bit lines ($V_{iv}$) greatly outnumber the cells with an active word line crossing an inactive bit line ($V_{ii}$). To minimize the overall disturbance of non-addressed cells in the matrix, one may therefore impose the requirement that $V_{iv}$ shall not be changed to compensate for the reduction in $V_{iii}$, in which case one has:

$$V_{ii} \to V_{ii} + \delta \quad (8)$$

Of course, this is not the only possible choice, but it shall be assumed hereafter to facilitate understanding of the basic principles involved.

Thus the $V_s/3$ protocol would be modified such that: $V_i = V_s$, $V_{ii} = V_s/3 + \delta$, $V_{iii} = V_s/3 - \delta$, $V_{iv} = -V_s/3$. This can be achieved by, e.g. leaving the potentials on the active word and bit lines unchanged, while adding $\delta$ to all inactive word and bit lines:

i) $V_i = V_s = \Phi_{activeBL} - \Phi_{activeWL}$: Active word line crossing active bit line (the selected cell)

ii) $V_{ii} = V_s/3 + \delta = (\Phi_{inactiveBL} + \delta) - \Phi_{activeWL}$: Active word line crossing inactive bit line iii) $V_{iii} = V_s/3 - \delta = \Phi_{activeBL} - (\Phi_{inactiveWL} + \delta)$: Inactive word line crossing active bit line iv) $V_{iv} = -V_s/3 = (\Phi_{inactiveBL} + \delta) - (\Phi_{inactiveWL} + \delta)$: Inactive word line crossing inactive bit line The magnitude of $\delta$ must be selected with due consideration to two conflicting requirements: On the one hand, it should be as large as possible in order to minimize parasitic current contributions to the active bit line. On the other hand, it should be as small as possible in order to minimize the disturbance of non-addressed cells. In practice, a decision must be made based on the specific conditions prevailing in each case.

Furthermore it is well-known to persons skilled in the art that the electrically polarizable materials used as the storage or memory medium in displays and memories can have a non-linear voltage-current response characteristic which may be exploited with advantage when implementing switching protocols involving offset voltages. Such non-linear response characteristic may however, also be dependent on the specific material and its treatment and factors which in the present context may depend on the pulsing protocol parameters actually used as well as design and scale factors. This implies that it will be impossible to generalize about a beneficial exploitation of non-linear voltage-current response in non-addressed cells, but that any specific embodiment involving this kind of response must be subject to the heuristics as applicable in each case. However, any heuristics of this kind shall be considered to lie outside the scope of the present application.

EXAMPLE 7

Full Row Readout

Figure 15:
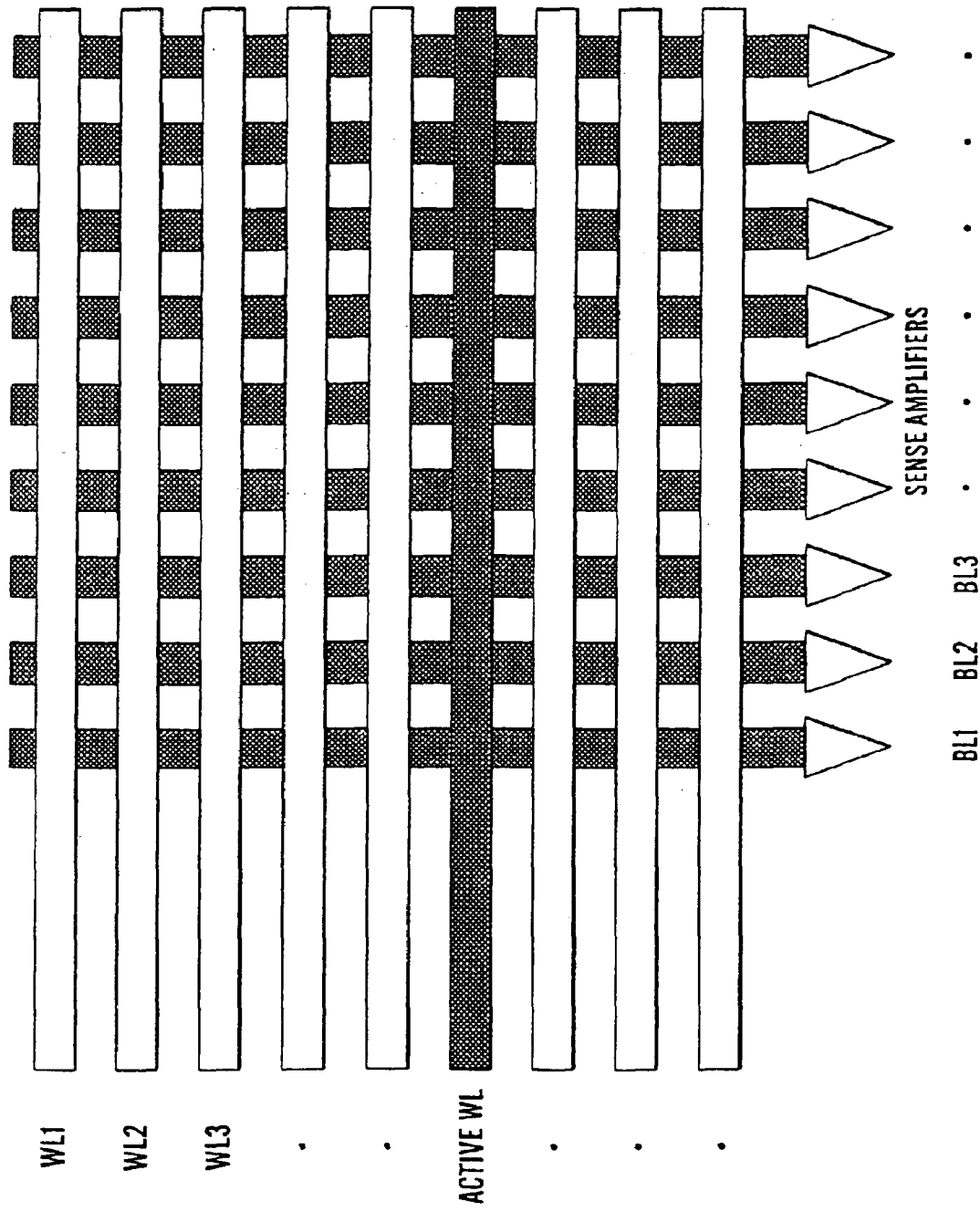

An alternative route to reducing or eliminating the spurious current contributions from non-addressed cells along active bit lines during readout is illustrated in FIG. 15. All word lines except the active one are clamped at a potential close to that at the sense amplifier input (defined as zero in FIG. 15). For readout of data, the active word line is brought to the potential $V_{READ}$, which causes currents to flow through the cells on the crossing bit lines. The magnitudes of the currents depend on the polarization state in each cell and are determined by the sense amplifiers, one for each bit line as shown. This scheme provides several advantages:

Voltages across all non-addressed cells are very close to zero, eliminating leakage currents that may otherwise corrupt the readout from the addressed cells.

The readout voltage $V_{READ}$ may be chosen much higher than the coercive voltage without incurring partial switching in non-addressed cells. This allows for film switching speeds approaching the intrinsic switching speed of the polarizable material in the cells.

The scheme is compatible with large matrix arrays.

The high degree of parallelism makes possible a large data readout rate.

Since the readout is destructive, it shall in many cases be necessary to write data back into the memory device. This can be achieved by one of the pulsing schemes described in the previous paragraphs. A different set of cells in the memory device from those that were read may be chosen for refresh, e.g. in conjunction with caching.

Possible disadvantages of this scheme are largely related to the increased demands on the circuitry performing the driving and sensing functions. Thus, the simultaneous switching of all cells on a long word line shall cause a large current surge on that line (implies a need for low source impedance in the driver stage and low impedance current paths. Also potential for cross-talk within the device). Furthermore, in order to avoid loss of data a separate sense amplifier is needed on each bit line. With the highest possible density of cells in the passive matrix, this poses a crowding problem at the edge of the matrix where the sense amplifiers are connected.

The switching protocols described above make possible the controlled switching of polarization direction of any given cell in a passive matrix arrangement, without subjecting non-addressed cells to disturbing voltages that exceed $\approx V_s/3$.

As described in the examples above, the pulsing protocols are directly applicable to the reading of logic states in memory cells that either experience no polarization switching during the read cycle, defined as being in e.g. a logic "0", or switch the direction of the polarization, correspondingly defined as being in a logic "1". Initialization of the memory could involve the writing of 0's in all cells, which in the case above would imply performing a read pulse cycle (destructive read). Writing would then be achieved by applying the pulse sequence for changing the polarization in those cells that shall store a logical "1" while leaving the rest of the cells unchanged. Subsequent reading of data from the memory would then require a refresh cycle to be implemented in those cases where it is desired to retain data in the memory following the destructive read. The refresh protocol would require a complete read/refresh pulse sequence in cases where other cells are used for renewed storage than those that were read destructively to provide the data. On the other hand, if the same cells are used, those cells that were read as logic "0" can be left unchanged and only those that contained a "1" need to be exposed to polarization switching.

What is claimed:

1. A method of driving a ferroelectric memory having an array of addressable cells, comprising:

driving a plurality of word lines, each of said plurality of word lines being arranged substantially parallel to each other; and driving a plurality of bit lines, each of said plurality of bit lines being arranged substantially parallel to each other, the plurality of word lines and bit lines being orthogonal such that the crossing points of the word lines and bit lines create the array of cells;

wherein the driving performs read and write operations on the plurality of word lines and bit lines by changing the voltages across selected cells, wherein the change in potential difference on any non-addressed cell does not significantly exceed ⅓ Vs wherein the potential difference across each non-addressed cell is about ⅓ $V_s$, wherein the potential difference across addressed cells is $V_s$ for a read operation and a write operation involving a change in the polarization state and ⅓ $V_s$ for a write operation when no change in the polarization state shall occur, wherein an addressed cell is a cell corresponding to an active bit line and active word line and a non-addressed cell is every other cell, and an active bit or word line is a bit or word line activated to read or write a cell and an inactive bit or word line is a bit or word line not activated to read or write a cell.

2. The method of claim 1, wherein each cell in the array is adjusted during a change in voltage in any one cell so that the sum of the voltage across the cells corresponding to 1) an active bit line, inactive word line, 2) an active word line, inactive bit line, and 3) an inactive word line, inactive bit line, is equal to Vs.

3. The method of claim 1, wherein the voltages on each of the plurality of cells can be any of n number of voltage potential levels.

4. The method of claim 3, wherein n=4.

5. The method of claim 4, wherein the predefined voltages are 0 Vs, ⅓ Vs, ⅔ Vs and Vs.

6. The method of claim 3, wherein n=5.

7. The method of claim 6, wherein the predefined voltages are 0 Vs, ⅓ Vs, ⅔ Vs, Vs and ⁴⁄₃ Vs.

8. The method of claim 1, further comprising sensing the voltages on each cell by a sensing circuit.

9. The method of claim 1, wherein the read and write operations are performed in accordance with a timing signal.

10. The method of claim 1, wherein the average voltage swing on any word line and bit line for both read and write operations corresponds to ⅓ $V_s$, the maximum value being ⅔ $V_s$, and the minimum value zero.

11. An apparatus that drives a ferroelectric memory having an array of addressable cells, comprising:

a plurality of word line devices situated substantially parallel to each other;

a plurality of bit line devices situated substantially parallel to each other, the word and bit lines being orthogonal such that the crossing points of the word lines and bit lines create the cells; and a controller that performs read write operations on the plurality of word lines and bit lines by supplying voltages to said word and bit lines to change the voltages across selected cells, wherein the change in potential difference on any non-addressed cell does not significantly exceed ⅓ Vs wherein the potential difference across each non-addressed cell is about ⅓ $V_s$, wherein the potential difference across addressed cells is $V_s$ for a read operation and a write operation involving a change in the polarization state and ⅓ Vs for a write operation when no change in the polarization state shall occur, wherein an addressed cell is a cell corresponding to an active bit line and active word line and a non-addressed cell is every other cell, and an active bit or word line is a bit or word line activated to read or write a cell and an inactive bit or word line is a bit or word line not activated to read or write a cell.

12. The apparatus of claim 11, wherein, each cell in the array is adjusted during a change in voltage in any one cell so that the sum of the voltage across the cells corresponding to 1) an active bit line, inactive word line, 2) an active word line, inactive bit line, and 3) an inactive word line, inactive bit line, is equal to Vs.

13. The apparatus of claim 11, wherein the voltage of each of the plurality of cells can be any of n number of voltage potential levels.

14. The apparatus of claim 13, wherein n=4.

15. The apparatus of claim 14, wherein the predefined voltages are 0 Vs, ⅓ Vs, ⅔ Vs and Vs.

16. The apparatus of claim 13, wherein n=5.

17. The apparatus of claim 16, wherein the predefmed voltages are 0 Vs, ⅓ Vs, ⅔ Vs, Vs and ⁴⁄₃ Vs.

18. The apparatus of claim 11, wherein the read and write operations are performed in accordance with a timing signal.

19. The apparatus of claim 11, further comprising a sensing circuit that senses the voltages across the cells.

20. The apparatus of claim 11, wherein the average voltage swing on any word line and bit line for both read and write operations corresponds to ⅓ $V_s$, the maximum value being ⅔ $V_s$, and the minimum value zero.

* * * * *